United States Patent
Yamashita et al.

(12) 
(10) Patent No.: US 6,648,128 B2
(45) Date of Patent: Nov. 18, 2003

(54) CONVEYOR, METHOD FOR CONVEYING A SEMICONDUCTOR WAFER, AND METHOD FOR MANUFACTURING A SEMICONDUCTOR DEVICE

(75) Inventors: Toshihiro Yamashita, Hyogo (JP); Toshio Komemura, Hyogo (JP); Toshihiko Noguchi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/133,740

(22) Filed: Apr. 29, 2002

(65) Prior Publication Data

US 2003/0042115 A1 Mar. 6, 2003

(30) Foreign Application Priority Data

Sep. 6, 2001 (JP) ........................................ 2001-270157

(51) Int. Cl.⁷ ............................................... B65G 17/24
(52) U.S. Cl. .................. 198/779; 198/494; 193/35 MD
(58) Field of Search ................................ 198/817, 779, 198/493, 494; 193/35 MD

(56) References Cited

U.S. PATENT DOCUMENTS

| | | | | | |
|---|---|---|---|---|---|
| 4,742,905 | A | * | 5/1988 | Beers | 198/779 |
| 5,238,099 | A | * | 8/1993 | Schroeder | 198/457.03 X |
| 5,404,997 | A | * | 4/1995 | Schreier | 198/779 |
| 6,318,544 | B1 | * | 11/2001 | O'Connor et al. | 198/779 X |
| 6,364,086 | B1 | * | 4/2002 | Blaurock et al. | 193/35 MD |

FOREIGN PATENT DOCUMENTS

| | | | | |
|---|---|---|---|---|
| DE | 224831 | * | 7/1985 | 198/779 |
| JP | 5-8855 | | 1/1993 | |
| JP | 7-204970 | | 8/1995 | |

* cited by examiner

*Primary Examiner*—James R. Bidwell
(74) *Attorney, Agent, or Firm*—McDermott, Will & Emery

(57) ABSTRACT

A conveyor is provided that is capable of preventing degradation in quality of an article being conveyed. The conveyor includes a conveyor belt; and a rolling element rotatably provided at a surface of the conveyor belt. A plurality of rolling elements are provided along a conveying direction. The conveyor further includes a holder provided at the surface of the conveyor belt, for rotatably holding the corresponding rolling element. The rolling element has a ball shape.

5 Claims, 10 Drawing Sheets

CONVEYOR, METHOD FOR CONVEYING A SEMICONDUCTOR WAFER, AND METHOD FOR MANUFACTURING A SEMICONDUCTOR DEVICE

BACKGROUND OF THE INVENTION

1. Field of the Invention

The present invention generally relates to a conveyor, a method for conveying a semiconductor wafer and a method for manufacturing a semiconductor device. More particularly, the present invention relates to a conveyor for conveying a work using a conveyor belt mounted on a pulley.

2. Description of the Background Art

Conventionally, methods using a conveyor belt are used to convey a wafer as a work in the manufacturing process of a semiconductor or an integrated circuit such as IC (integrated circuit) or LSI (large scale integration).

FIG. 10 is a plan view of a conventional conveyor. FIG. 11 is a side view of the conveyor as viewed from the direction shown by arrow XI in FIG. 10. Referring to FIG. 10, the conventional conveyor 100 includes pulleys 41, 42, 43 and 44, and conveyor belts 11 and 12 mounted on the corresponding pulleys 41 to 44.

The conveyor belt 11 is mounted on the pulleys 41 and 43, and the conveyor belt 12 is mounted on the pulleys 42 and 44. A rotation shaft 45 connects the pulleys 41 and 42 to each other. A rotation shaft 46 connects the pulleys 43 and 44 to each other. The rotation shaft 45 is connected to a motor 48 through a driving shaft 47. Therefore, when the motor 48 rotates the driving shaft 47, the rotation is transmitted to the pulleys 41 and 42 through the rotation shaft 45. The pulleys 41 and 42 drive the conveyor belts 11 and 12. A semiconductor wafer 1 as a work is placed on the conveyor belts 11 and 12. Driving the conveyor belts 11 and 12 enables the semiconductor wafer 1 to be conveyed.

Referring to FIG. 11, the pulleys 42 and 44 have a disk shape, and are respectively provided with the rotation shafts 45 and 46 in the center thereof. When the rotation shaft 45 rotates in the direction shown by arrow R1, the pulley 42 also rotates in that direction. This allows the semiconductor wafer 1 on the conveyor belt 12 to be conveyed.

Note that the conveyor belts 11 and 12 are each formed from, e.g., an O ring of silicon rubber. The pulleys 41 to 44 are formed from, e.g., JIS (Japanese Industrial Standard) SUS303 stainless steel. A direct current (DC) motor is used as the motor 48.

Conventionally, in order to stop the semiconductor wafer 1 as a work at an arbitrary position, the semiconductor wafer 1 being conveyed is stopped with stoppers 51 and 52, and also rotation of the pulleys 41 and 42 is stopped. At this time, rotation of the conveyor belts 11 and 12 must be stopped as soon as the stoppers 51 and 52 are made in contact with the semiconductor wafer 1. This is because the conveyor belts 11 and 12 would otherwise slide on the semiconductor wafer 1. As a result, friction is generated between the semiconductor wafer 1 and the conveyor belts 11 and 12, scattering scrapings. This contaminates the semiconductor wafer 1, resulting in degraded quality of the semiconductor wafer.

Due to a large contact area between the semiconductor wafer 1 and the conveyor belts 11 and 12, sliding of the conveyor belts 11 and 12 on the semiconductor wafer 1 would produce belt-like flaws on the back surface of the semiconductor wafer 1. This also degrades the quality of the semiconductor wafer 1.

SUMMARY OF THE INVENTION

The present invention is made in view of the foregoing problems, and it is an object of the present invention to provide a conveyor capable of preventing degradation in quality of a work being conveyed.

A conveyor according to one aspect of the present invention includes: a conveyor belt; and a rolling element rotatably provided at a surface of the conveyor belt.

According to the conveyor structured as such, the rolling element is rotatably provided at the surface of the conveyor belt. By placing a work on the rolling element, the rolling element is interposed between the work and the conveyor belt. Therefore, the conveyor belt will not slide on the work even when it moves relative to the work. As a result, friction can be prevented from being generated between the work and the conveyor belt, preventing degradation in quality of the work.

Preferably, a plurality of rolling elements are provided along a conveying direction. In this case, the work can be supported with a plurality of rolling elements, enabling stable conveyance of the work.

Preferably, the conveyor further includes a holder provided at the surface of the conveyor belt, for rotatably holding the rolling element. In this case, the holder allows the rolling element to be stably held at the surface of the conveyor belt.

Preferably, the rolling element has a ball shape. In this case, the ball-shaped rolling element point-contacts the work, enabling the contact area between the work and the rolling element to be minimized. This can prevent damages (like a flaw) to the surface of the work being in contact with the rolling element, preventing degradation in quality of the work.

Preferably, the conveyor further includes a cleaning member for cleaning the rolling element. This enables the surface of the rolling element to be cleaned by the cleaning member, preventing a contaminant from adhering to the rolling element and the work.

Preferably, the conveyor belt conveys a semiconductor wafer.

A conveyor according to another aspect of the present invention includes: a conveyor belt; a pulley for driving the conveyor belt; a rotating means connected to the pulley so as to rotate the pulley; and a clutch mechanism for disconnecting the rotating means from the pulley when torque transmitted from the rotating means to the pulley exceeds a prescribed value.

In the conveyor structured as such, the clutch mechanism disconnects the rotating means from the pulley when the torque transmitted from the rotating means to the pulley exceeds a prescribed value. Accordingly, when the work being conveyed on the conveyor belt is stopped and thus the torque transmitted from the rotating means to the pulley exceeds a prescribed value, the rotating means is disconnected from the pulley. The pulley is thus stopped without being rotated by the rotating means, so that the conveyor belt will not slide on the work. As a result, degradation in quality of the work can be prevented.

Preferably, the rotation means includes a rotation shaft, and the clutch mechanism includes a ratchet mounted to the rotation shaft.

Preferably, the conveyor further includes a rolling element rotatably provided at a surface of the conveyor. In this case, the rolling element is rotatably provided at the surface of the conveyor. By placing a work on the rolling element, the rolling element is interposed between the work and the conveyor belt. Therefore, the conveyor belt will not slide on the work even when it moves relative to the work. As a result, friction can be prevented from being generated between the work and the conveyor belt, preventing degradation in quality of the work.

Preferably, a plurality of rolling elements are provided along a conveying direction. In this case, the work can be supported with a plurality of rolling elements, enabling stable conveyance of the work.

Preferably, the conveyor further includes a holder provided at the surface of the conveyor belt, for rotatably holding the rolling element. In this case, the holder allows the rolling element to be stably held at the surface of the conveyor belt.

Preferably, the rolling element has a ball shape. In this case, the ball-shaped rolling element point-contacts the work, enabling the contact area between the work and the rolling element to be minimized. This can prevent damages (like a flaw) to the surface of the work being in contact with the rolling element, preventing degradation in quality of the work.

Preferably, the conveyor further includes a cleaning member for cleaning the rolling element. This enables the surface of the rolling element to be cleaned by the cleaning member, preventing a contaminant from adhering to the rolling element and the work.

Preferably, the conveyor belt conveys a semiconductor wafer.

A method for conveying a semiconductor wafer according to the present invention includes the steps of preparing any one of the above conveyors; and conveying a semiconductor wafer using the conveyor.

A method for manufacturing a semiconductor device according to the present invention includes the steps of: preparing any one of the above conveyors; and conveying a semiconductor wafer using the conveyor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in conjunction with the accompanying drawings.

(First Embodiment)

Figure 1:
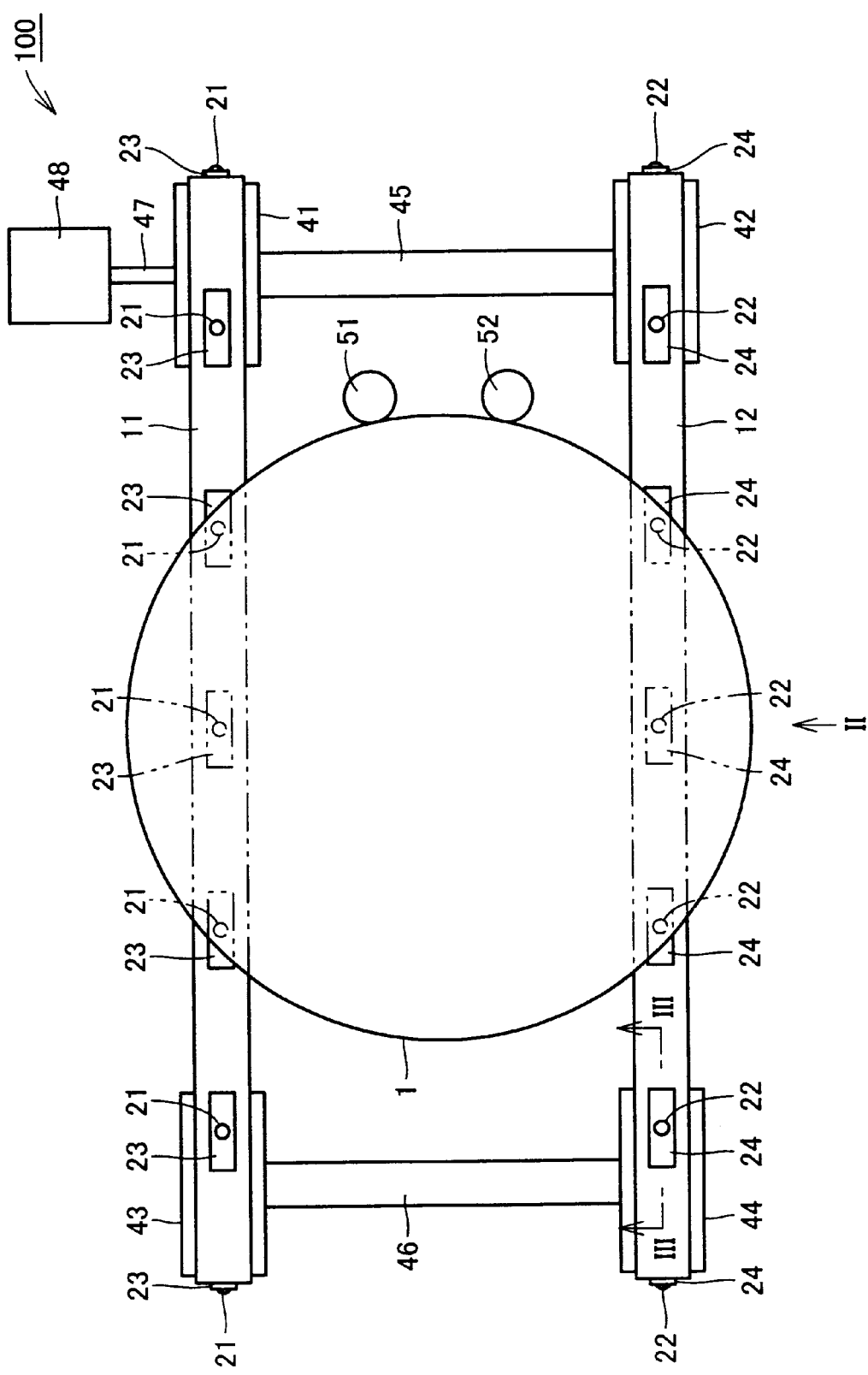
FIG. 1 is a plan view of a conveyor according to a first embodiment of the present invention.

Referring to FIG. 1, a conveyor 100 according to the first embodiment of the present invention includes conveyor belts 11 and 12, and rolling elements 21 and 22 rotatably mounted at the surface of the conveyor belts 11 and 12. A plurality of rolling elements 21 and a plurality of rolling elements 22 are provided along the conveying direction. The conveyor 100 further includes holders 23 and 24 for rotatably holding the rotating elements 21 and 22, respectively. The holders 23 and 24 are provided at the surface of the conveyor belts 11 and 12, respectively. The rolling elements 21 and 22 have a ball shape. The conveyor belts 11 and 12 convey a semiconductor wafer 1 as a work.

The conveyor 100 further includes pulleys 41, 42, 43 and 44, and the conveyor belts 11 and 12 are mounted on the corresponding pulleys 41 to 44.

The conveyor belt 11 is mounted on the pulleys 41 and 43, and the conveyor belt 12 is mounted on the pulleys 42 and 44. A rotation shaft 45 connects the pulleys 41 and 42 to each other. A rotation shaft 46 connects the pulleys 43 and 44 to each other. The rotation shaft 45 is connected to a motor 48 through a driving shaft 47. Therefore, when the motor 48 rotates the driving shaft 47, the rotation is transmitted to the pulleys 41 and 42 through the rotation shaft 45. The pulleys 41 and 42 drive the conveyor belts 11 and 12. The semiconductor wafer 1 as a work is placed on the conveyor belts 11 and 12. Driving the conveyor belts 11 and 12 enables the semiconductor wafer 1 to be conveyed.

The holders 23 are provided at the surface of the conveyor belt 11 at regular intervals so as to hold the respective rolling elements 21. The holders 24 are provided in the conveyor belt 12 at regular intervals so as to hold the respective rolling elements 22. The semiconductor wafer 1 as a work is an article to be conveyed. For example, a single crystal silicon wafer of 8 inches (20.3 cm) in diameter is used as the semiconductor wafer 1.

For example, toothed timing belts are used as the conveyor belts 11 and 12. The timing belts may be formed from, e.g., Viton. The pulleys 41 to 44 may be formed from, e.g., JIS SUS303 stainless steel. A DC motor is used as the motor 48.

Stoppers 51 and 52 are members for contacting the semiconductor wafer 1 being conveyed in order to stop the semiconductor wafer 1 at an arbitrary position. The stoppers 51 and 52 are formed from PTFE (polytetrafluoroethylene). The rolling elements 21 and 22 are held in the respective holders 23 and 24, and are mounted on the entire circumference of the respective conveyor belts 11 and 12. For example, a metal such as JIS SUS316 stainless steel having its surface lined with PTFE (polytetrafluoroethylene) may be used as a material of the rolling elements 21 and 22. The holders 23 and 24 may be formed from Diflon (polychlorotrifluoroethylene).

The semiconductor wafer 1 is held by six rolling elements 21 and 22. In order to hold the semiconductor wafer 1 stably, the semiconductor wafer 1 must be held by at least three rolling elements 21 and 22.

Figure 2:
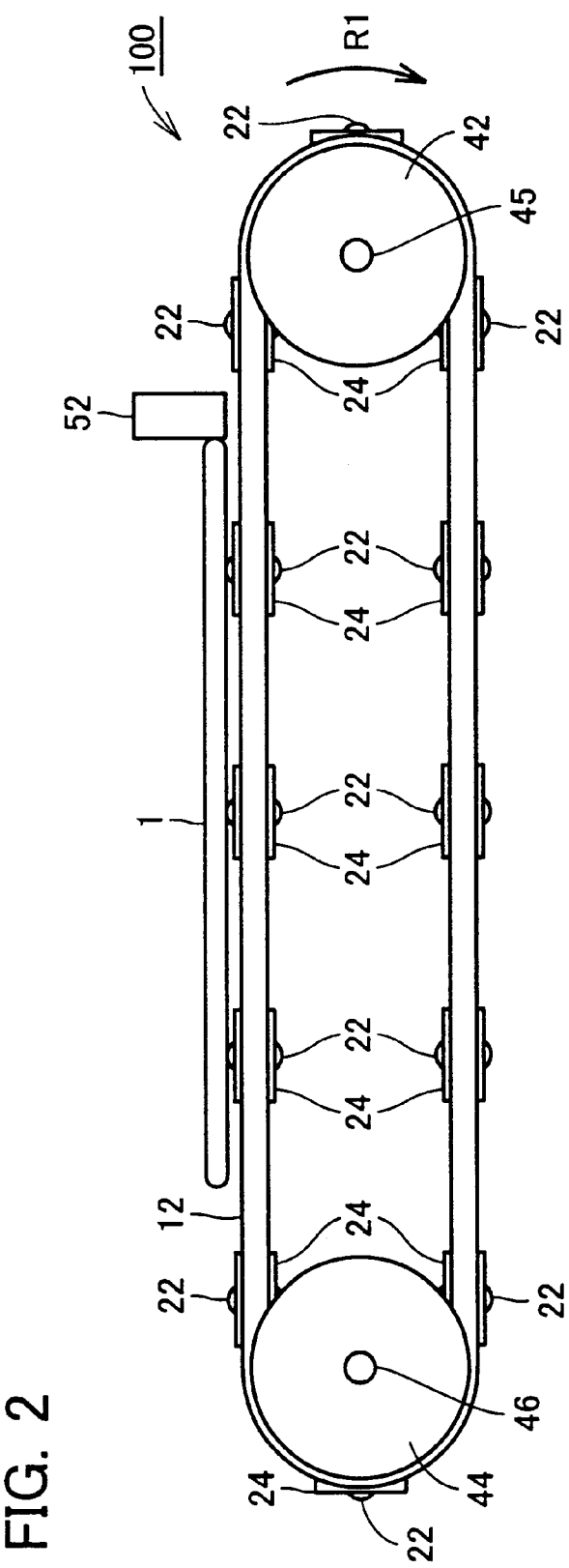
FIG. 2 is a side view of the conveyor as viewed from the direction shown by arrow II in FIG. 1.

Referring to FIG. 2, in the conveyor 100 according to the first embodiment of the present invention, the semiconductor wafer 1 is placed on the rolling elements 22. The semiconductor wafer 1 is held by three rolling elements 22.

The holders 24 and the rolling elements 22 are provided at regular intervals. By rotating the pulley 42 in the direction shown by arrow R1, the conveyor belt 12, the holders 24 mounted to the conveyor belt 12 and the rolling elements 22 held in the holders 24 also rotate in that direction.

Figure 3:
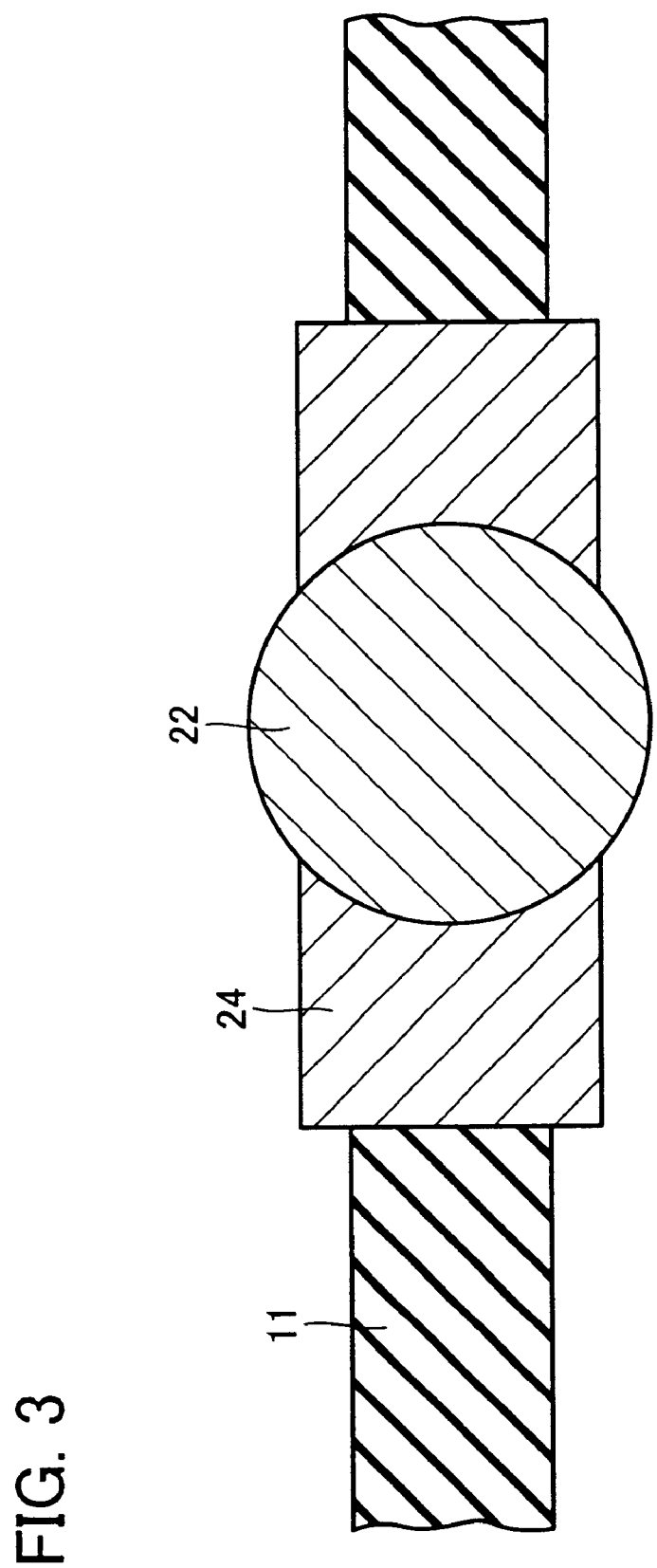
FIG. 3 is a cross-sectional view taken along line III—III in FIG. 1.

Referring to FIG. 3, the holder 24 is mounted to the conveyor belt 11. The holder 24 is thicker than the conveyor belt 11. The holder 24 has a spherical inner surface, in which the rolling element 22 is fit. The rolling element 22 contacts the inner peripheral surface of the holder 24, and is held in the holder 24. The rolling element 22 thus rotates while being positioned at a prescribed position. The rolling element 22 protrudes from the surfaces of the holder 24.

Hereinafter, operation of the conveyor 100 according to the first embodiment will be described. In order to convey the semiconductor wafer 1 with the conveyor 100, the semiconductor wafer 1 is first placed on the rolling elements 21 and 22. The motor 48 is used to rotate the driving shaft 47 and the rotation shaft 45 in the direction shown by arrow R1. The pulleys 41 and 42 as well as the conveyor belts 11 and 12 thus rotate in the direction shown by arrow R1. The semiconductor wafer 1 placed on the conveyor belt 11 with the rolling elements 21 and 22 interposed therebetween is conveyed in this way. In order to stop the semiconductor wafer 1 at an arbitrary position, the stoppers 51 and 52 are made in contact with the semiconductor wafer 1. The semiconductor wafer 1 is thus stopped. If the pulleys 11 and 12 cannot be stopped abruptly, the conveyor belts 11 and 12 move relative to the semiconductor wafer 1. However, the rotatable rolling elements 21 and 22 are interposed between the conveyor belts 11 and 12 and the semiconductor wafer 1. Therefore, the rotating elements 21 and 22 rotate, so that the conveyor belts 11 and 12 will not slide on the semiconductor wafer 1.

According to the conveyor 100 of the first embodiment structured as such, even when the conveyor belts 11 and 12 move relative to the semiconductor wafer 1, the rolling elements 21 and 22 interposed therebetween rotate. This enables generation of wear and foreign matters resulting from sliding between the semiconductor wafer 1 and the conveyor belts 11 and 12 to be eliminated, preventing the semiconductor wafer 1 from being degraded in quality while being conveyed. Moreover, the rolling elements 21 having a ball shape point-contact the back surface of the semiconductor wafer 1. This also enables reduction in adhesion of foreign matters to the semiconductor wafer 1 resulting from contact, as compared to the conventional example.

(Second Embodiment)

Figure 4:
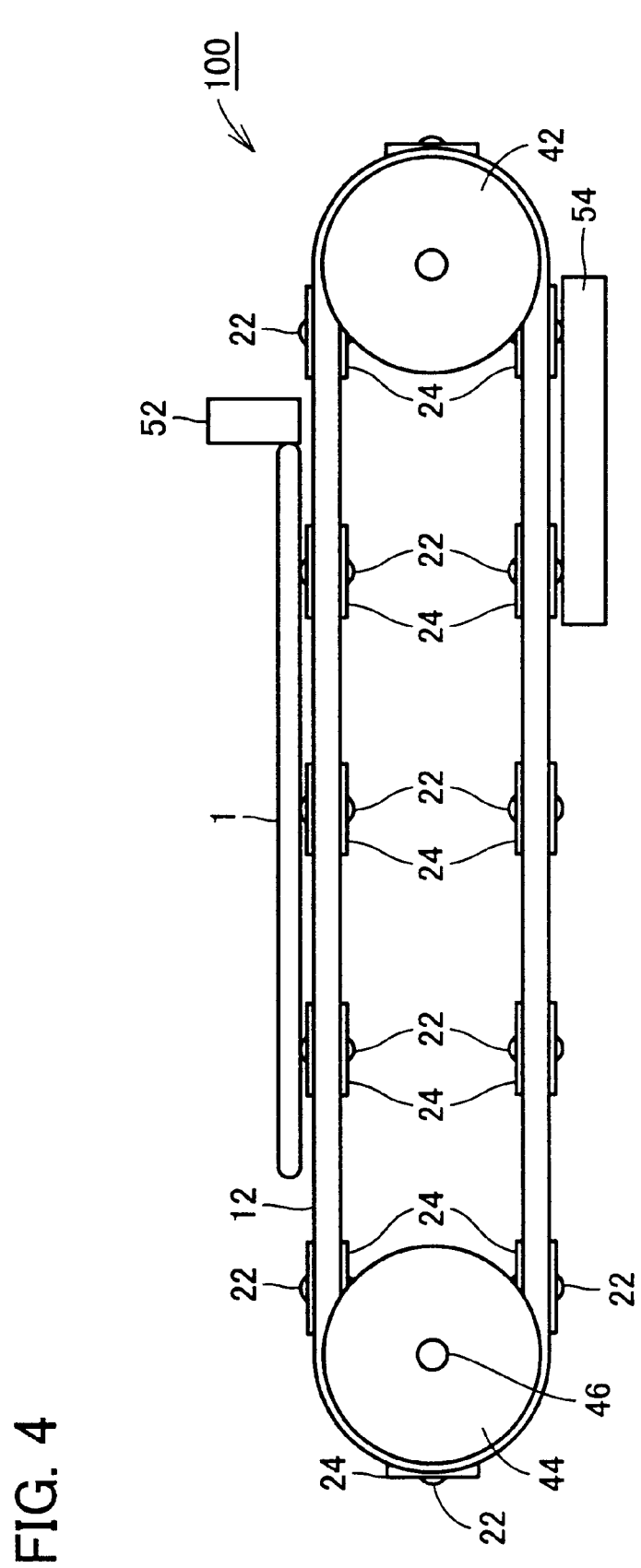
FIG. 4 is a side view of a conveyor according to a second embodiment of the present invention.

Referring to FIG. 4, a conveyor 100 according to the second embodiment of the present invention is different from that of the first embodiment in that the conveyor 100 of the second embodiment additionally includes a cleaning mechanism 54 as a cleaning member.

More specifically, the conveyor 100 of the second embodiment further includes a cleaning mechanism 54 as a cleaning member for cleaning the rolling elements 22. The cleaning mechanism 54 cleans the rolling elements 22 that directly contact the semiconductor wafer 1, so that the rolling elements 22 are kept clean. A clean wipe such as miracle wipe soaked with ethanol may be used as the cleaning mechanism 54.

The cleaning mechanism 54 is disposed below the conveying surface of the semiconductor wafer 1. The cleaning mechanism 54 is in contact with the surface of the rolling elements 22. In response to driving of the conveyor belt 12, the rolling elements 22 roll on the cleaning mechanism 54 so that foreign matters adhering to the surface of the rolling elements 22 are removed and cleaned. Note that, although not shown in the figure, the same pulleys 41 and 43, conveyor belt 11, rolling elements 21 and holders 23 as those of the first embodiment are present on the opposite side of the figure. A cleaning mechanism for cleaning the rolling elements 21 is also provided.

The conveyor 100 of the second embodiment structured as such has the same effects as those of the conveyor 100 of the first embodiment. Moreover, the cleaning mechanism 54 removes foreign matters adhering to the rolling elements 22, so that the rolling elements 22 can always be kept clean. This enables further reduction in adhesion of foreign matters to the semiconductor wafer 1.

(Third Embodiment)

Figure 5:
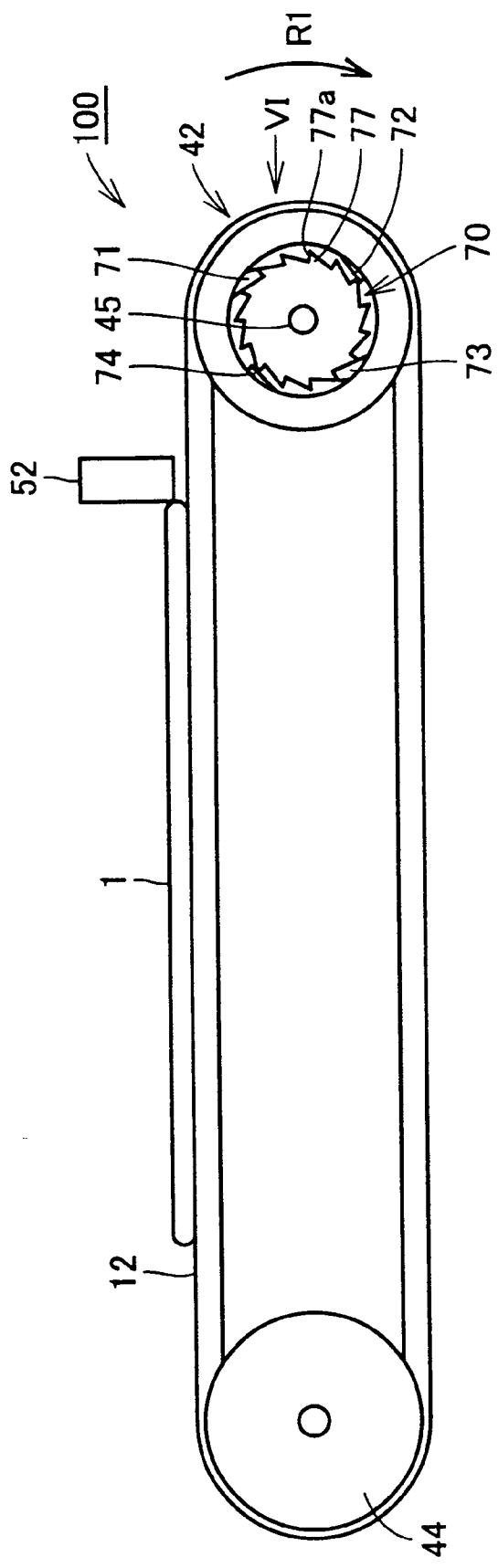
FIG. 5 is a side view of a conveyor according to a third embodiment of the present invention.

Referring to FIG. 5, a conveyor 100 according to the third embodiment of the present invention includes a conveyor belt 12, pulleys 42 and 44 for driving the conveyor belt 12, a rotation shaft 45 as a rotation means connected to the pulley 42 for rotation thereof, and a clutch mechanism 70 for disconnecting the rotation shaft 45 from the pulley 42 when the torque transmitted from the rotation shaft 45 to the pulley 42 exceeds a prescribed value. The rotation means includes the rotation shaft 45, and the clutch mechanism 70 includes a ratchet mounted to the rotation shaft 45.

No rolling element as shown in the first and second embodiments is provided at the surface of the conveyor belt 12, and the semiconductor wafer 1 is in direct contact with the conveyor belt 12. The clutch mechanism 70 formed from a ratchet includes a wheel 77 having recesses 77a, and pawls 71, 72, 73 and 74 capable of fitting in the recesses 77a. The pawls 71 to 74 are attached to the pulley 42 so as to rotate with the pulley 42. The pawls 71 and 73 fit in the recesses 77a.

Note that, although not shown in the figure, the same pulleys 41, 43 and conveyor belt 11 as those of the first embodiment are present on the opposite side of the figure, and a clutch mechanism 70 is incorporated in the pulley 41. No holder and rolling element are provided at the surface of the conveyor belt 11.

Figure 6:
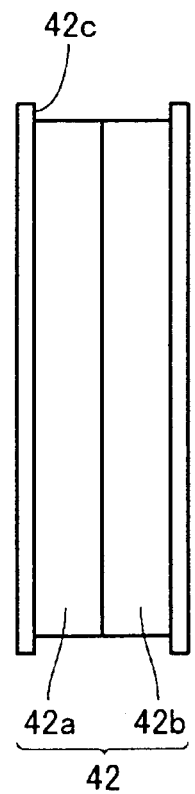
FIG. 6 is a side view of a pulley as viewed from the direction shown by arrow VI in FIG. 5.

Referring to FIG. 6, the pulley 42 is formed from a first ring 42a and a second ring 42 that are in contact with each other. The wheel 77 shown in FIG. 5 is positioned in the space between the first ring 42a and the second ring 42b. The pulley 42 has a groove 42c, in which the conveyor belt 12 is fit.

Figure 7:
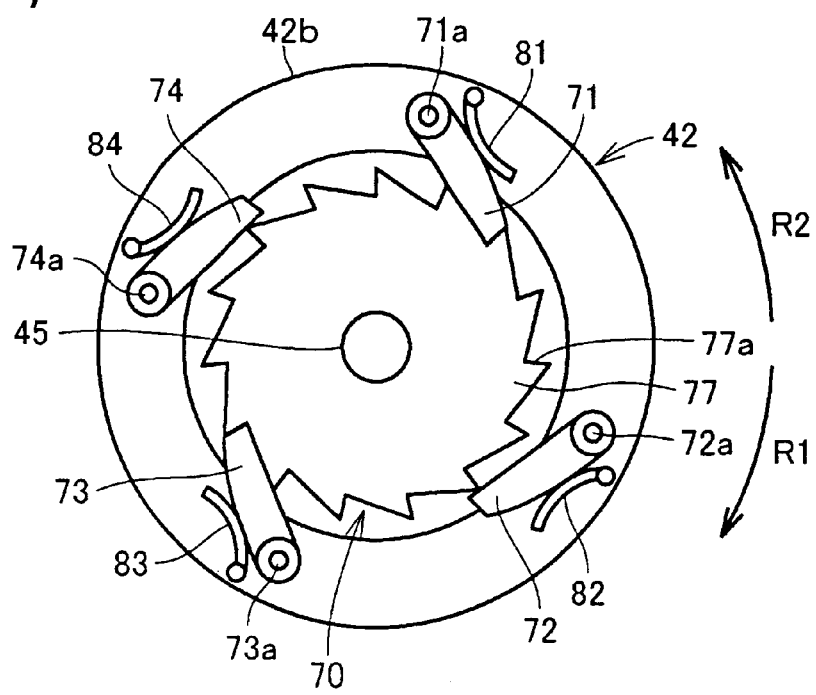
FIG. 7 is an exploded side view of a pulley, illustrating a clutch mechanism.

Referring to FIG. 7, the clutch mechanism 70 formed from a ratchet includes the wheel 77 and the pawls 71 to 74 capable of fitting in the recesses 77a of the wheel 77. The wheel 77 is mounted to the rotation shaft 45 so as to rotate therewith. The pawls 71 to 74 are pivotally mounted to the second ring 42b by means of pins 71a to 74a. In other words, the pawls 71 to 74 pivot about the respective pins 71a to 74a. The pawls 71 to 74 are biased toward the wheel 77 due to contact with respective leaf springs 81 to 84. In other words, the leaf springs 81 to 84 press the respective pawls 71 to 74 against the wheel 77.

The pawls 71 to 74 are pressed against the wheel 77 by the respective leaf springs 81 to 84. Therefore, in response to rotation of the wheel 77 in the direction shown by arrow R1 by the rotation shaft 45, the pulley 42 also rotates in that direction when small load is applied thereto. The expression "when small load is applied to the pulley 42" herein includes the following cases: the conveyor belt 12 is connected to the pulley 42 and the semiconductor wafer 1 is placed on the conveyor belt 12, but the semiconductor wafer 1 is not in contact with the stoppers 51 and 52; and nothing is placed on the conveyor belt 12. In such a case, the torque transmitted from the rotation shaft 45 to the pulley 42 is a prescribed value or less. Therefore, the clutch mechanism 70 will not disconnect the rotation shaft 45 from the pulley 42. Note that, when the rotation shaft 45 rotates in the direction shown by arrow R2, the pulley 42 also rotates in that direction regardless of the load applied to the pulley 42.

In contrast, when increased load is applied to the pulley 42, the pulley 42 will not rotate in the direction shown by arrow R1 even if the rotation shaft 45 rotates in the direction shown by arrow R1. In this case, the pawls 71 to 74 pivot abut the respective pins 71a to 74a, thereby releasing rotation of the wheel 77. As a result, the wheel 77 spins, so that the pulley 42 does not rotate. Note that the expression "when increased load is applied to the pulley 42" herein includes the case where the semiconductor wafer 1 placed on the conveyor belt 12 is stopped by contact with the stoppers 51 and 52.

Note that the components of the clutch mechanism 70 may be formed from, e.g., PTFE (polytetrafluoroethylene).

In such a conveyor 100, small load is normally applied to the pulley 42 while the semiconductor wafer 1 is being conveyed. Therefore, the pulley 42 rotates with the rotation shaft 45. Thus, the semiconductor wafer 1 can be conveyed. When the semiconductor wafer 1 is stopped by the stoppers 51 and 52, frictional force is generated between the semiconductor wafer 1 and the conveyor belt 12. This frictional force applies large load to the pulley 42, actuating the clutch mechanism 70. Thus, the wheel 77 slips, whereby the pulley 42 is stopped.

In the conveyor 100 of the third embodiment structured as such, operation of the clutch mechanism 70 causes the pulley 42 to slip when the semiconductor wafer 1 is stopped by the stoppers 51 and 52. As a result, the conveyor belt 12 is stopped, and thus can be prevented from sliding on the semiconductor wafer 1. This enables generation of foreign matters at the back surface of the semiconductor wafer 1 to be suppressed, preventing degradation in quality of the semiconductor wafer 1.

(Fourth Embodiment)

Figure 8:
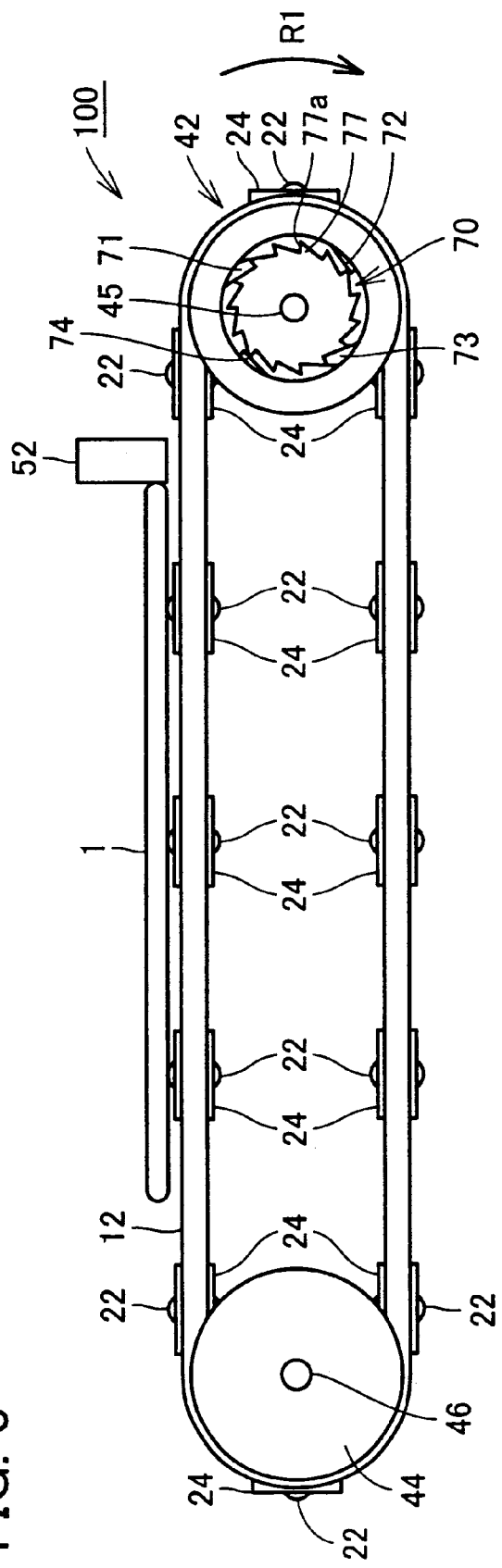
FIG. 8 is a side view of a conveyor according to a fourth embodiment of the present invention.

Referring to FIG. 8, a conveyor 100 according to the fourth embodiment of the present invention includes holders 24 and rolling elements 22 at the conveyor belt 12 as in the case of the first embodiment. The conveyor 100 of the fourth embodiment further includes a clutch mechanism 70 within the pulley 42.

The conveyor 100 of the forth embodiment structured as such has the same effects as those of the conveyors of the first to third embodiments. In addition, even if the rolling elements 22 no longer rotate due to some failure, the clutch mechanism 70 is actuated in response to stopping of the semiconductor wafer 1 by the stopper 52. Thus, driving of the conveyor belt 12 can be discontinued. There may be a case where the clutch mechanism 70 no longer operates due to some failure. In such a case, the rolling elements 22 rolls on the semiconductor wafer 1 even when the semiconductor wafer 1 is stopped by the stopper 52. Thus, the conveyor belt 12 can be prevented from sliding on the semiconductor wafer 1. As a result, foreign matters can further be prevented from being generated at the back surface of the semiconductor wafer 1, preventing degradation in quality of the semiconductor wafer 1.

(Fifth Embodiment)

Figure 9:
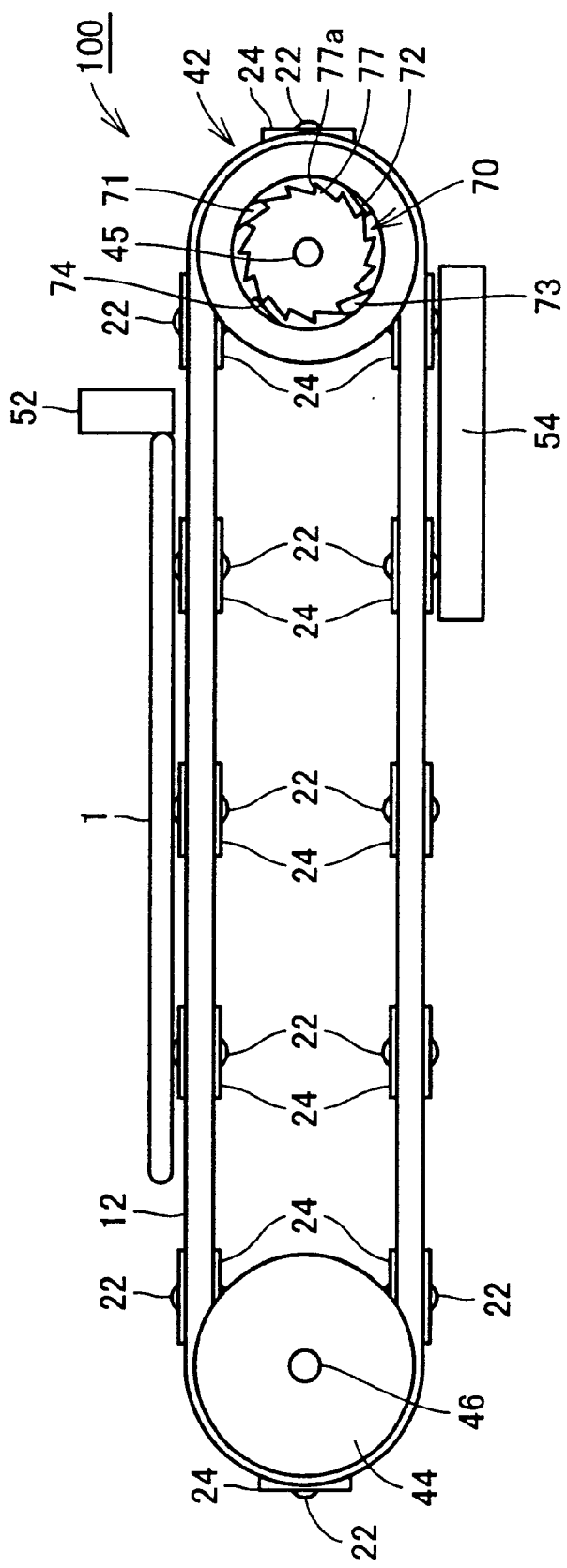
FIG. 9 is a side view of a conveyor according to a fifth embodiment of the present invention.
Figure 10:
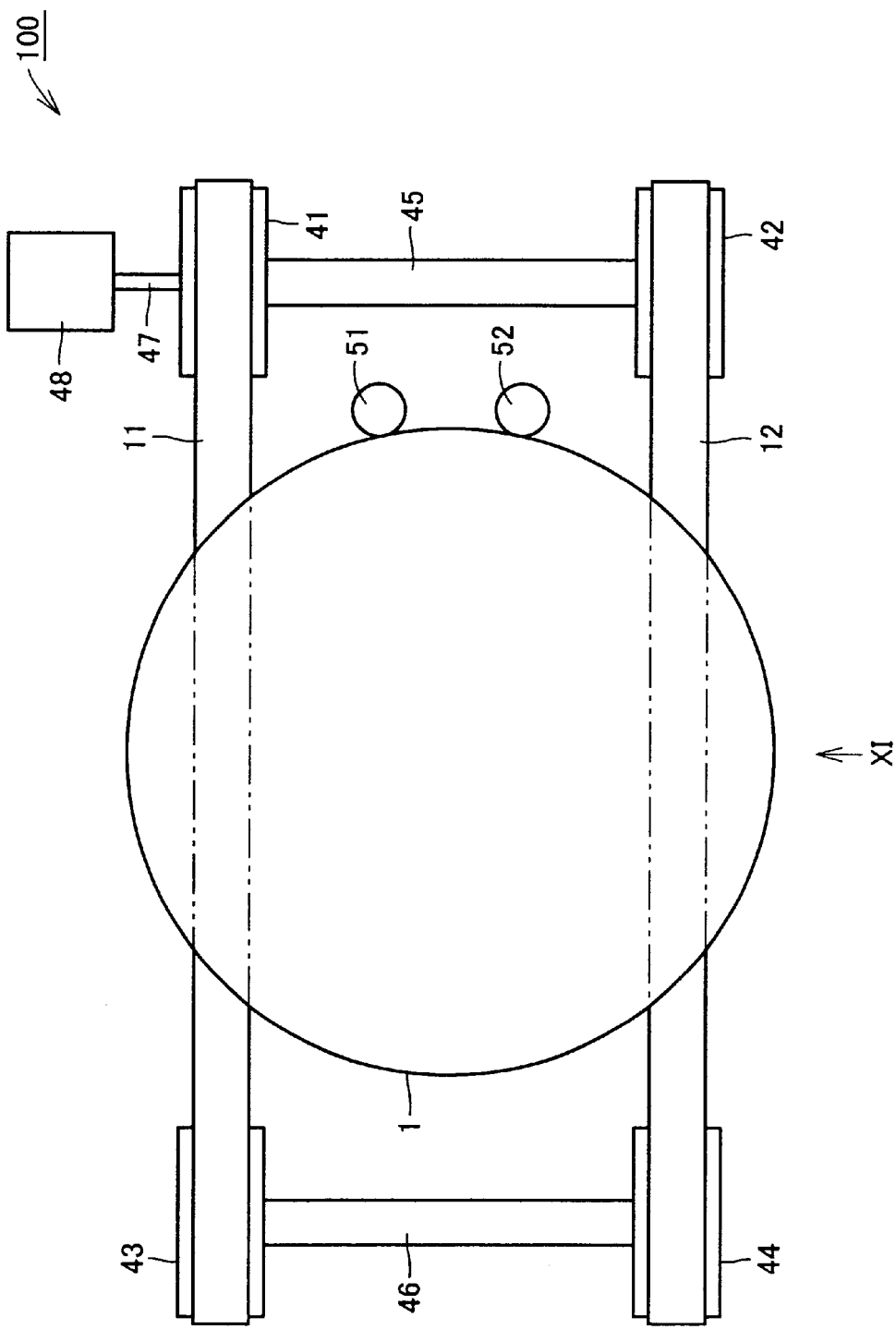
FIG. 10 is a plan view of a conventional conveyor.
Figure 11:
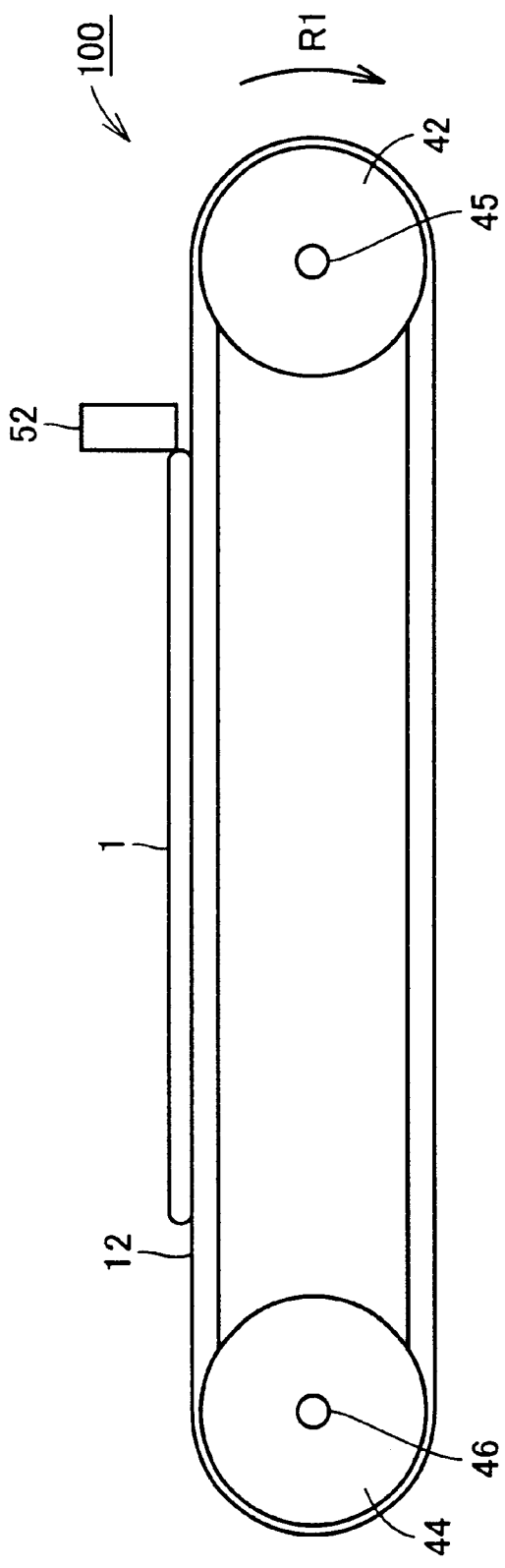
FIG. 11 is a side view of a conveyor as viewed from the direction shown by arrow XI in FIG. 10.

Referring to FIG. 9, a conveyor 100 according to the fifth embodiment of the present invention is different from that of the fourth embodiment in that the conveyor 100 of the fifth embodiment additionally includes a cleaning mechanism 54. The cleaning mechanism 54 is the same as that shown in the second embodiment, and serves to clean the rolling elements 22.

The conveyor 100 of the fifth embodiment structured as such has the same effects as those of the conveyors of the second and fourth embodiments.

Although embodiments of the present invention have been described, various modifications of the embodiments are possible. First, the rolling elements 22 may have a roller shape instead of a ball shape. Moreover, the clutch mechanism 70 may be an electromagnetic clutch or the like instead of a mechanical clutch using a ratchet. In this case, a detection portion for detecting the torque applied to the pulley 42 is also required. The conveyor belt may be a V belt, a flat belt or the like.

According to the present invention, a conveyor can be provided that is capable of preventing degradation in quality of a work, i.e., an article being conveyed.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A conveyor, comprising:
    a conveyor belt having a continuous surface, portions thereof respectively disposed in an upper conveying level and a lower return level;
    a rolling element rotatably provided at the surface of the conveyor belt;
    a holder provided at the surface of the conveyor belt, for rotatably holding the rolling element; and
    a cleaning member disposed below the return level of the conveyor belt for contact with the rolling element, wherein the rolling element rolls on the cleaning member for cleaning the rolling element.

2. The conveyor according to claim 1, wherein a plurality of rolling elements are provided along a conveying direction.

3. The conveyor according to claim 1, wherein said conveyor belt conveys a semiconductor wafer.

4. The conveyor according to claim 1, wherein said rolling element has a ball shape.

5. A method of conveying a semiconductor wafer, comprising the steps of:
    preparing the conveyor according to claim 1, and
    conveying a semiconductor wafer using said conveyor.

* * * * *

UNITED STATES PATENT AND TRADEMARK OFFICE
CERTIFICATE OF CORRECTION

PATENT NO.    : 6,648,128 B2
DATED         : November 18, 2003
INVENTOR(S)   : Toshihiro Yamashita et al.

It is certified that error appears in the above-identified patent and that said Letters Patent is hereby corrected as shown below:

<u>Title page,</u>
Item [73], Assignee, change "Mitsubishi Denki Kabushiki Kaisha" to -- Renesas Technology, Corp. --.

Signed and Sealed this

Eighteenth Day of May, 2004

JON W. DUDAS
*Acting Director of the United States Patent and Trademark Office*